US009123682B2

(12) United States Patent
Mizusaki et al.

(10) Patent No.: US 9,123,682 B2
(45) Date of Patent: Sep. 1, 2015

(54) LIGHT-EMITTING DEVICE

(71) Applicant: JOLED INC., Tokyo (JP)

(72) Inventors: Naoko Mizusaki, Osaka (JP); Kenichi Nendai, Hyogo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/131,505

(22) PCT Filed: Apr. 17, 2013

(86) PCT No.: PCT/JP2013/002584
§ 371 (c)(1),
(2) Date: Jan. 8, 2014

(87) PCT Pub. No.: WO2013/168365
PCT Pub. Date: Nov. 14, 2013

(65) Prior Publication Data
US 2015/0076455 A1    Mar. 19, 2015

(30) Foreign Application Priority Data

May 9, 2012   (JP) .................................. 2012-107381

(51) Int. Cl.
*H01L 27/32* (2006.01)
*H01L 51/52* (2006.01)
*H01L 51/50* (2006.01)

(52) U.S. Cl.
CPC .......... *H01L 27/3276* (2013.01); *H01L 51/529* (2013.01); *H01L 27/3211* (2013.01); *H01L 27/3216* (2013.01); *H01L 51/5016* (2013.01)

(58) Field of Classification Search
USPC ......................................................... 257/89
IPC ...................................... H01L 27/3276,27/3215
See application file for complete search history.

(56) References Cited

U.S. PATENT DOCUMENTS

| 7,675,075 | B2* | 3/2010 | Nagai ............................ | 257/90 |
| 7,932,112 | B2* | 4/2011 | Yokoyama et al. ............. | 438/34 |
| 8,384,105 | B2* | 2/2013 | Tetz et al. ....................... | 257/98 |
| 8,581,291 | B2* | 11/2013 | Shimokawa et al. ........... | 257/99 |
| 8,735,874 | B2* | 5/2014 | Yamazaki et al. .............. | 257/40 |
| 8,754,429 | B2* | 6/2014 | Koizumi et al. ................ | 257/98 |

(Continued)

FOREIGN PATENT DOCUMENTS

| JP | 2000-137211 | 5/2000 |
| JP | 2002-318556 | 10/2002 |

(Continued)

OTHER PUBLICATIONS

International Search Report (ISR) in International Patent Application No. PCT/JP2013/002584, dated Jul. 30, 2013.

*Primary Examiner* — Eugene Lee
(74) *Attorney, Agent, or Firm* — Greenblum & Bernstein, P.L.C.

(57) ABSTRACT

A light-emission device includes a substrate and a G light-emission layer; an R light-emission layer, a B light-emission layer, and a wiring layer made of metal that are each arranged above the substrate. Each of the G light-emission layer, the R light-emission layer, and the B light-emission layer contains light-emission material. An amount of heat that the B light-emission layer generates upon light emission is greater than an amount of heat that the G light-emission layer generates upon light emission. Further, the B light-emission layer directly faces the wiring layer at a facing edge portion.

12 Claims, 12 Drawing Sheets

(56) References Cited

U.S. PATENT DOCUMENTS

| | | |
|---|---|---|
| 2002/0158835 A1 | 10/2002 | Kobayashi et al. |
| 2004/0160170 A1 | 8/2004 | Sato et al. |
| 2004/0164668 A1 | 8/2004 | Kanno et al. |
| 2007/0190887 A1 | 8/2007 | Sato et al. |
| 2010/0244005 A1 | 9/2010 | Gyoda |
| 2013/0009179 A1* | 1/2013 | Bhat et al. .................. 257/89 |

FOREIGN PATENT DOCUMENTS

| | | |
|---|---|---|
| JP | 2004-207217 | 7/2004 |
| JP | 2005-222915 | 8/2005 |
| JP | 2008-234841 | 10/2008 |
| JP | 2010-231979 | 10/2010 |

* cited by examiner (a)

(b)

LIGHT-EMITTING DEVICE

TECHNICAL FIELD

The present invention relates to a structure of a light-emission device having a plurality of light-emission units each of a different light-emission color.

BACKGROUND ART

In recent years, research is in progress of a light-emission element having a light-emission layer that contains light-emission material such as organic light-emission material and inorganic light-emission material. One example of such a light-emission element is an organic electroluminescence element (hereinafter referred to as an "organic EL element"). An organic EL element is an example of a current-driven light-emission element. An organic EL element makes use of an electroluminescence phenomenon of organic light-emission material. For example, a typical organic EL element includes a thin film transistor (TFT) substrate, an anode made of a metal such as Al, a light-emission layer made of an organic light-emission material, and a cathode that is made of a transparent material such as Indium Tin Oxide (ITO). In the organic EL element, the TFT substrate, the anode, the light-emission layer, and the cathode are layered in the stated order. Further, an organic EL element may include, in addition to the above, such layers as a hole injection layer, a hole transport layer, an electron injection layer, an electron transport layer, and a sealing layer, as necessary.

A light-emission element such as an organic EL element is widely used in a light-emission device or the like. One example of such a light-emission device is an organic EL display panel having one or more organic EL elements disposed above a substrate. In addition, to realize display in color, a light-emission device, such as an organic EL display panel, including a plurality of light-emission units each of a different light-emission color is in practical use.

Here, one technical problem related to a conventional light-emission device is the problem that a light-emission element included therein undergoes degradation due to heat generated by a light-emission layer included in the light-emission element during light emission. As countermeasures against this problem, proposals have been made of light-emission devices capable of discharging heat generated by a light-emission layer included therein to the outside (Patent Literatures 1 and 2). One of such light-emission devices discharges heat generated by the light-emission layer to the outside via a heat discharge member that is disposed facing the substrate of the light-emission element and that is composed of a heat discharge sheet and a metal plate. Another one of such light-emission devices discharges heat generated by the light-emission layer to the outside via a black matrix portion that is disposed surrounding an entirety of the light-emission unit and that is composed of material having high heat conductivity.

CITATION LIST

Patent Literature

[Patent Literature 1]
Japanese Patent Application Publication No. 2008-234841
[Patent Literature 2]
Japanese Patent Application Publication No. 2010-231979
[Patent Literature 3]
Japanese Patent Application Publication No. 2000-137211

SUMMARY OF INVENTION

Technical Problem

Meanwhile, in a light-emission device having a plurality of light-emission units each of a different light-emission color, the amount of heat generated upon light emission by one light-emission layer may differ from the amount of heat generated upon light emission by another light-emission layer, even when the light-emission units respectively including such light-emission layers are caused to emit light at the same luminance. In view of such problems, the present invention provides a light-emission device that has a plurality of light-emission units each of a different light-emission color and that is capable of effectively discharging heat generated by a light-emission layer generating a relatively great amount of heat.

Solution to the Problems

An aspect of the present invention is a light-emission device comprising: a substrate; a first light-emission unit above the substrate, the first light-emission unit including a first light-emission layer that contains light-emission material; a second light-emission unit above the substrate, the second light-emission unit including a second light-emission layer that contains light-emission material and that is adjacent to the first light-emission layer; a third light-emission unit above the substrate, the third light-emission unit including a third light-emission layer that contains light-emission material and that is adjacent to the first light-emission layer, wherein an amount of heat that the third light-emission layer generates upon light emission is greater than each of an amount of heat that the first light-emission layer generates upon light emission and an amount of heat that the second light-emission layer generates upon light emission; and a wiring layer above the substrate and adjacent to the third light-emission layer, the wiring layer being made of metal and comprising a line structure or a matrix structure. In the light-emission device pertaining to an aspect of the present invention, the third light-emission layer has a longer facing edge portion than each of the first light-emission layer and the second light-emission layer, a facing edge portion of a given light-emission layer being an edge portion directly facing the wiring layer, or the third light-emission layer has a larger facing surface portion than each of the first light-emission layer and the second light-emission layer, a facing surface portion of a given light-emission layer being a surface portion directly facing the wiring layer.

Advantageous Effects of the Invention

In the light-emission device pertaining to an aspect of the present invention, the first light-emission layer, the second light-emission layer, and the wiring layer are arranged such that the discharge of heat from the third light-emission layer to the wiring layer is promoted. The third light-emission layer generates a greater amount of heat compared to each of the first light-emission layer and the second light-emission layer. Due to this, the present invention realizes, with respect to a light-emission device having a plurality of light-emission units each of a different color, effectively discharging heat generated by a light-emission layer generating a relatively great amount of heat to the outside.

DESCRIPTION OF EMBODIMENTS

Figure 1:
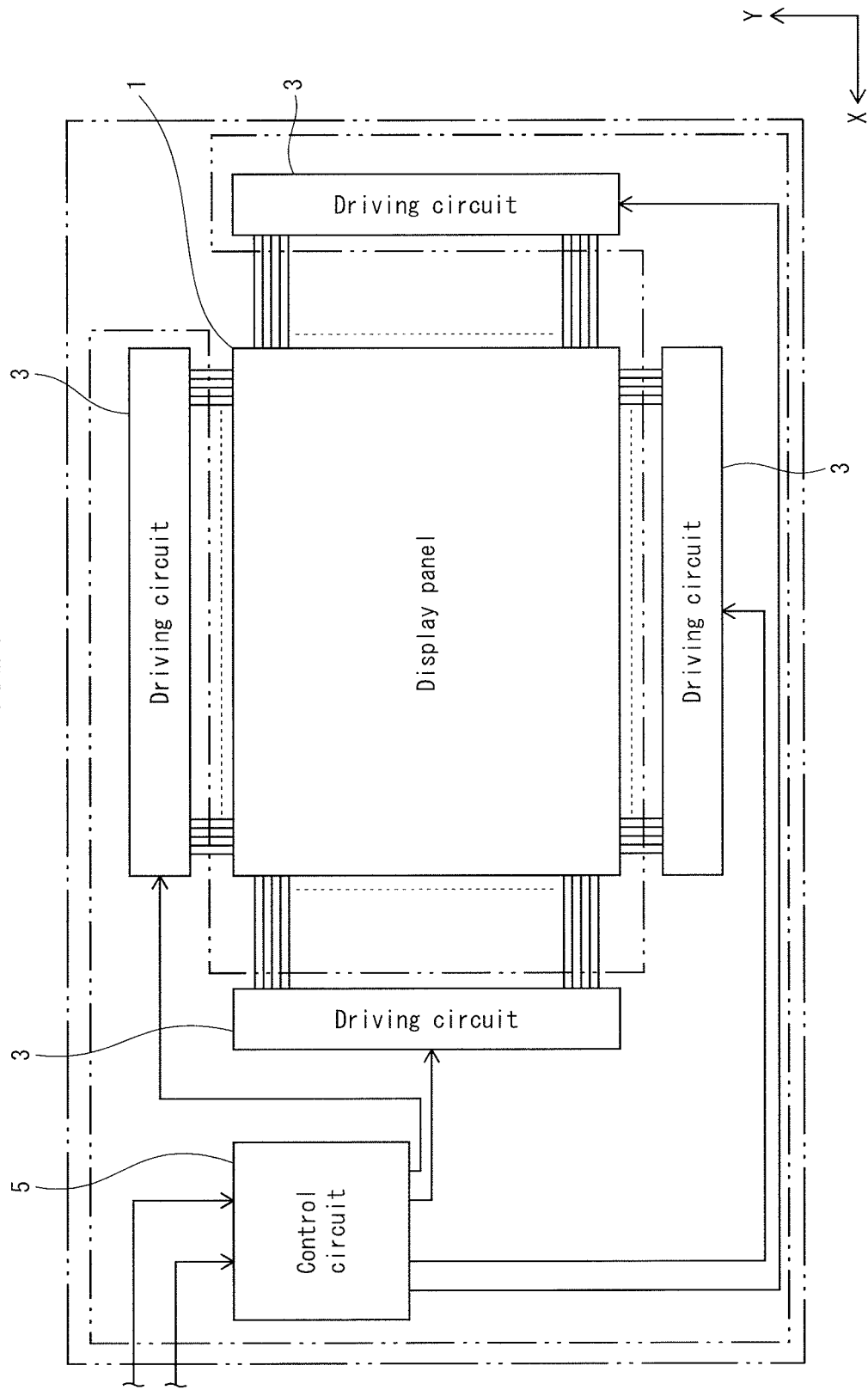
FIG. 1 is a schematic block diagram illustrating an overall structure of an organic EL display panel pertaining to an embodiment of the present invention.

How the Inventors Arrived at an Aspect of the Present Invention

Before describing the above-described aspect of the present invention in detail, description is provided in the following on how the present inventors arrived at the aspect of the present invention.

Recent years have seen an increase in a size of light-emission devices. Considering such circumstances, the present inventors conducted an investigation for a structure, applicable to a light-emission device having a plurality of light-emission units each of a different color, for effectively discharging heat generated by the light-emission units to the outside. In the process, the present inventors first conducted an investigation concerning the amount of heat generated by light-emission layers. As a result of the investigation, the present inventors found that the amount of heat generated by light-emission layers differed depending upon the light-emission colors of the light-emission units, i.e., the amount of heat generated by a light-emission layer in a light-emission unit of a given light-emission color differs from the amount of heat generated by a light-emission layer in a light-emission unit of another light-emission color. Note that in the present disclosure, the phrase "amount of heat generated by a light-emission layer" refers to the amount of heat generated by a given light-emission layer when light-emission units of a light-emission device, including the light-emission unit that includes the given light-emission layer, are caused to perform light emission at the same luminance.

In order to provide light-emission units with different light-emission colors, one possible measure would be to provide the light-emission units with light-emission layers containing different light-emission material. When the light-emission material differs for each of different light-emission colors, a light-emission layer containing light-emission material having lower light-emission efficiency compared to light-emission material contained in another light-emission layer needs to be provided with greater current than provided to the other light-emission layer, even when causing the light-emission units to emit light at the same luminance. Accordingly, the amount of heat generated by the light-emission layer containing the light-emission material of lower light-emission efficiency becomes greater than the amount of heat generated by the other light-emission layer. Thus, the amount of heat generated by a light-emission layer varies between different light-emission units, even when the light-emission units are caused to emit light at the same luminance.

Another possible measure to be taken in order to provide light-emission units with different light-emission colors would be to include, in each light-emission unit, a light-emission layer emitting white light and a color filter of a corresponding light-emission color disposed above the light-emission layer. According to this measure, the light-emission color of a color filter included in one light-emission unit differs from the light-emission color of a color filter included in another light-emission unit. Here, it should be noted that when taking such a measure, a light-emission layer in one light-emission unit, disposed below a color filter transmitting a relatively small amount of light, needs to be caused to emit light at a greater luminance compared to a light-emission layer in another light-emission unit, disposed below a color filter transmitting a relatively great amount of light. This results in the necessity of providing a relatively great current to the light-emission layer disposed below the color filter transmitting a relatively small amount of light. This further results in a relatively great amount of heat being generated by the light-emission layer disposed below the color filter transmitting a relatively small amount of light. Thus, the amount of heat generated by a light-emission layer varies between different light-emission units, even when the light-emission units are caused to emit light at the same luminance.

Taking such factors into consideration, the present inventors, in order to realize effective discharge of heat in a light-emission device having a plurality of light-emission units each of a different light-emission color, arranged a light-emission layer that generates a relatively great amount of heat relatively close to a wiring layer made of metal. When arranging a given light-emission layer close to a wiring layer made of metal, the heat generated by the light-emission layer is discharged to the outside via the wiring layer. The present inventors have found that, by making such a configuration in a light-emission device, the heat generated by a light-emission layer generating a relatively great amount of heat is effectively discharged. The aspect of the present invention has been achieved in such a manner.

Overview of an Aspect of the Present Invention

The light-emission device pertaining to an aspect of the present invention comprises: a substrate; a first light-emission unit above the substrate, the first light-emission unit including a first light-emission layer that contains light-emission material; a second light-emission unit above the substrate, the second light-emission unit including a second light-emission layer that contains light-emission material and that is adjacent to the first light-emission layer; a third light-emission unit above the substrate, the third light-emission unit including a third light-emission layer that contains light-emission material and that is adjacent to the first light-emission layer, wherein an amount of heat that the third light-emission layer generates upon light emission is greater than each of an amount of heat that the first light-emission layer generates upon light emission and an amount of heat that the second light-emission layer generates upon light emission; and a wiring layer above the substrate and adjacent to the third light-emission layer, the wiring layer being made of metal and comprising a line structure or a matrix structure. In the light-emission device pertaining to an aspect of the present invention, the third light-emission layer has a longer facing edge portion than each of the first light-emission layer and the second light-emission layer, a facing edge portion of a given light-emission layer being an edge portion directly facing the wiring layer, or the third light-emission layer has a larger facing surface portion than each of the first light-emission layer and the second light-emission layer, a facing surface portion of a given light-emission layer being a surface portion directly facing the wiring layer.

Due to having such a structure, the light-emission device pertaining to an aspect of the present invention effectively discharges the heat generated by a light-emission layer generating a relatively great amount of heat.

Embodiment 1

1. Overall Structure

In the following, description is provided on one embodiment of the present invention, with reference to the accompanying drawings. FIG. 1 is a schematic block diagram illustrating an overall structure of a light-emission device including an organic EL display panel 1 pertaining to embodiment 1 of the present invention. Here, the organic EL display panel 1 is a top-emission type organic EL display panel. That is, light emitted by a light-emission layer disposed above a glass substrate is guided out from a side of the organic EL display panel 1 opposite the glass substrate with respect to the light-emission layer. Further, the organic EL display panel 1 does not include an electron injection layer, a hole injection layer, or a color filter. As such, in the organic EL display panel 1, a light-emission layer corresponds to a light-emission unit.

As illustrated in FIG. 1, driving circuits 3 are connected to the organic EL display panel 1. A control circuit 5 controls the driving circuits 3. The organic EL display panel 1 is a light-emission device making use of an electroluminescence phenomenon of organic material, and includes an array of a plurality of organic EL elements. Note that FIG. 1 merely illustrates one example of the arrangement of the driving circuits 3 and the control circuit 5. In an actual light-emission device, the arrangement of the driving circuits 3 and the control circuit 5 is not limited to that illustrated in FIG. 1.

Figure 2:
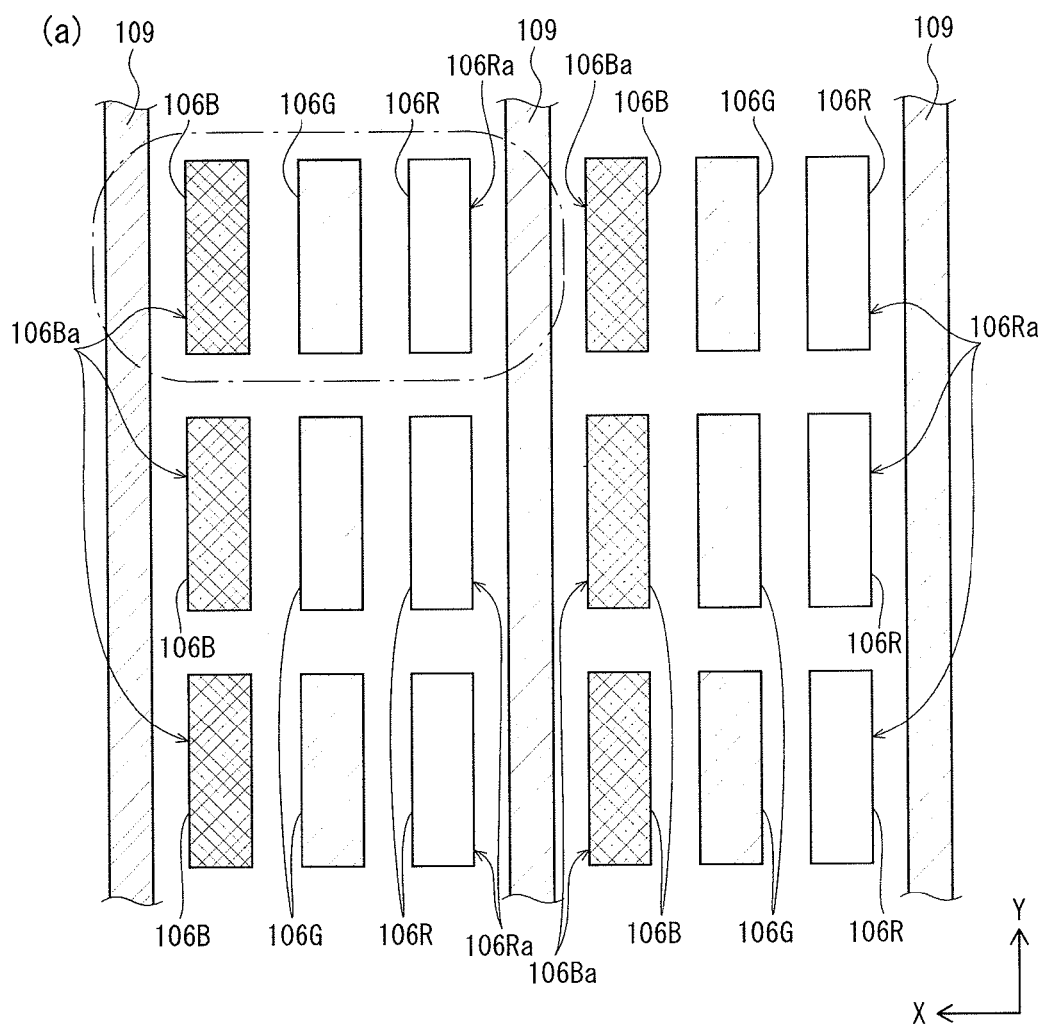
FIG. 2 includes portion (a) that is a plan view illustrating a layout of light-emission layers and a wiring layer in the organic EL display panel illustrated in FIG. 1, and portion (b) that is an enlarged view of a part of the layout illustrated in the plan view in portion (a).
Figure 2:
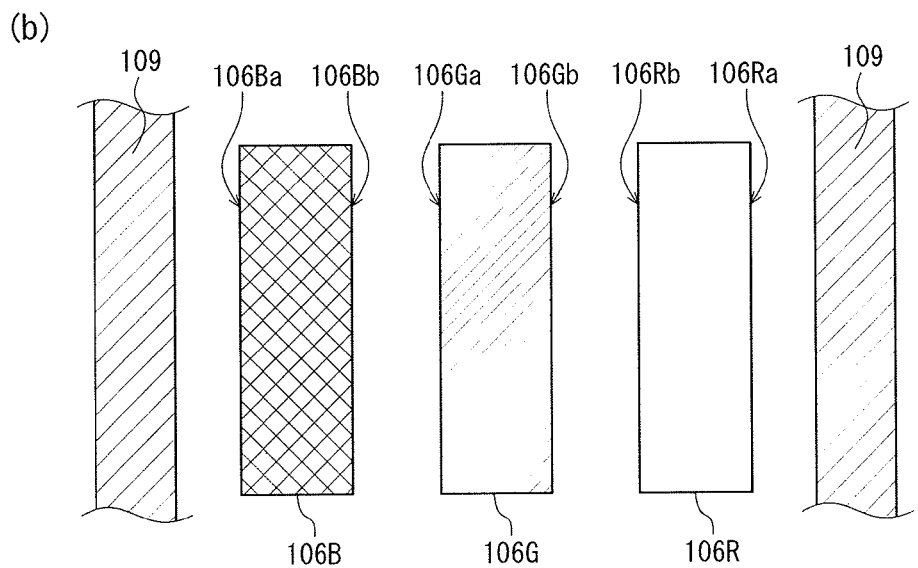

Portion (a) of FIG. 2 is a plan view illustrating a layout of light-emission layers and a wiring layer in the organic EL display panel 1 illustrated in FIG. 1, and portion (b) of FIG. 2 is an enlarged view of the part of the layout in portion (a) encircled by the dashed-dotted line. The organic EL display panel 1 includes a plurality of green (G) light-emission layers 106G, a plurality of blue (B) light-emission layers 106B, and a plurality of red (R) light-emission layers 106R, which are arranged in the shape of a matrix. Here, a G light-emission layer 106G, a B light-emission layer 106B, and an R light-emission layer 106R are formed to have the same rectangular shape and to have the same area. Further, the G light-emission layer 106G functions as the first light-emission layer, the B light-emission layer 106B functions as the second light-emission layer, and the R light-emission layer 106R functions as the third light-emission layer. In addition, the term "light-emission layers 106" is used in the following to collectively refer to a combination of the G light-emission layer 106G, the B light-emission layer 106B, and the R light-emission layer 106R, where it is unnecessary to distinguish the different types of light-emission layers from one another. In addition, the organic EL display panel 1 includes a wiring layer 109. The wiring layer 109 is composed of line portions each having the shape of a line, and extends in the column direction of the organic EL display panel 1 (i.e., the Y direction in FIG. 1). Further, between adjacent line portions of the wiring layer 109, a plurality of pixels each including one G light-emission layer 106G, one B light-emission layer 106B, and one R light-emission layer 106R arranged in the row direction of the organic EL display panel 1 (i.e., the X direction in FIG. 1) are arranged.

As description has already been provided above, in the present embodiment: (i) the G light-emission layer 106G, the B light-emission layer 106B, and the R light-emission layer 106R respectively function as the first light-emission layer, the second light-emission layer, and the third light-emission layer; (ii) the light-emission layers 106 are formed to have the same rectangular shape; and (iii) the light-emission layers 106 are arranged in the shape of a matrix. However, the present invention is not limited to this, and the light-emission layers 106 may be formed such that each of the G light-emission layer 106G, the B light-emission layer 106B, and the R light-emission layers 106R forms one line. In such a case, the light-emission layers 106, when seen as a whole, are arranged in the form of stripes.

Due to the wiring layer 109, the B light-emission layers 106B, and the R light-emission layers 106R being arranged as illustrated in FIGS. 2A and 2B, in each pixel, the B light-emission layer 106B and the R light-emission layer 106R have a facing edge portion 106Ba and a facing edge portion 106Ra, respectively. Specifically, the B light-emission layer 106B faces the wiring layer 106 at the facing edge portion 106Ba, and the R light-emission layer 106R faces the wiring layer 106 at the facing edge portion 106Ra. Note that in the present embodiment, when a given light-emission layer 106 has a "facing edge portion", the facing edge portion is an edge of the given light-emission layer (i) which is substantially parallel with the direction in which the line portions of the wiring layer 109 extend (i.e., the column direction (Y direction)), and (ii) at which the given light-emission layer 106 faces the wiring layer 109 without another light-emission layer 106 existing in between. In the following, detailed description of the facing edge portions is provided with reference to portion (b) of FIG. 2. The edge 106Ba of the B light-emission layer 106B is a facing edge portion since another light-emission layer 106 does not exist between the edge 106Ba and the wiring layer 109. Similarly, the edge 106Ra of the R light-emission layer 106R is a facing edge portion since another light-emission layer 106 does not exist between the edge 106Ra and the wiring layer 109. In contrast, an edge 106Ga of the G light-emission layer 106G is not a facing edge portion since the B light-emission layer 106B exists between the edge 106Ga and the wiring layer 109. Similarly, an edge 106Gb of the G light-emission layer 106G is not a facing edge portion since the R light-emission layer 106R exists between the edge 106Gb and the wiring layer 109. Further, an edge 106Bb of the B light-emission layer 106B is not a facing edge portion since the G light-emission layer 106G and the R light-emission layer 106R exist between the edge 106Bb and the wiring layer 109. Similarly, an edge 106Rb of the R light-emission layer 106R is not a facing edge portion since the B light-emission layer 106B and the G light-emission layer 106G exist between the edge 106Rb and the wiring layer 109. Accordingly, in the arrangement described up to this point, the G light-emission layer 106G does not have a facing edge portion, and thus does not "directly face" the wiring layer 109.

The light-emission colors of the G light-emission layer 106G functioning as the first light-emission layer, the B light-emission layer 106B functioning as the second light-emission layer, and the R light-emission layer 106R functioning as the third light-emission layer are G, B, and R, respectively. Further, the light-emission layer 106G, the B light-emission layer 106B, and the R light-emission layer 106R contain different light-emission material. Further, the light-emission material contained in the light-emission layers 106 is either organic light-emission material of a fluorescent type or organic light-emission material of a phosphorescent type. Here, note that typically, blue light-emission material, as contained in the B light-emission layer 106B, has lower light-emission efficiency compared to each of green light-emission material, as contained in the G light-emission layer 106G, and red light-emission material, as contained in the R light-emission layer 106R. Further, red light-emission material typically has lower light-emission efficiency compared to green light-emission material. Due to this, the amount of heat generated by the B light-emission layer 106B is greater than the amount of heat generated by each of the R light-emission layer 106R and the G light-emission layer 106G. Further, the amount of heat generated by the R light-emission layer 106R is greater than the amount of heat generated by the G light-emission layer 106G. Note that in the present embodiment, the light-emission material contained in the B light-emission layer 106B, the light-emission material contained in the G light-emission layer 106G, and the light-emission material contained in the R light-emission layer 106R have light-emission efficiencies of 3, 30, and 10, respectively. In other words, the light-emission efficiency of the B light-emission layer 106B corresponds to 10.0% of the light-emission efficiency of the G light-emission layer 106G, and the light-emission efficiency of the R light-emission layer 106R corresponds to 33.3% of the light-emission efficiency of the G light-emission layer 106G.

Here, note that in the present disclosure, the first light-emission layer, the second light-emission layer, and the third light-emission layer refer to three different types of light-emission layers generating a different amount of heat when caused to perform light emission at the same luminance. Specifically, when caused to perform light emission at the same luminance, the first light-emission layer generates the smallest amount of heat, the second light-emission layer generates an intermediate amount of heat, and the third light-emission layer generates the greatest amount of heat.

Figure 3:
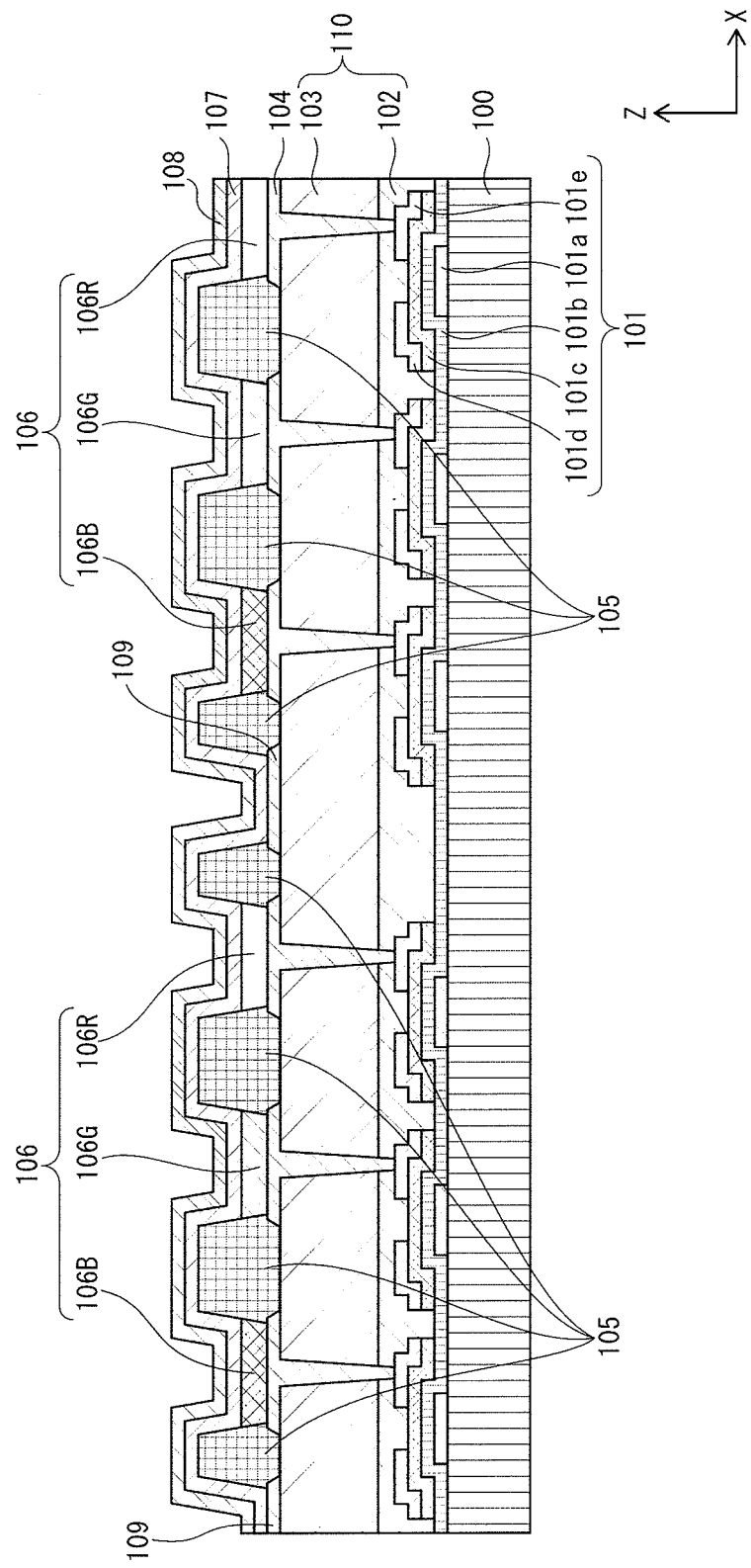
FIG. 3 is a cross-sectional view of the organic EL display panel illustrated in FIG. 1.

FIG. 3 is a cross-sectional view of the organic EL display panel illustrated in FIG. 1. Note that FIG. 3 is a cross-sectional view of FIG. 2.

In the cross-section illustrated in FIG. 3, the organic EL display panel 1 includes a glass substrate 100, a TFT substrate 110, anodes 104, and barrier wall layers 105. The TFT substrate 110 includes TFT layers 101, interlayer insulating layers 102, and planarizing layers 103. The anodes 104 are formed on the TFT substrate 110, and one anode 104 is provided for each light-emission unit of the organic EL display panel 1. Each of the barrier wall layers 105 is disposed between adjacent ones of the anodes 104. Each of the TFT layers 101 is composed of electrodes 101a, 101b, 101c, a source electrode 101d, and a drain electrode 101e. Further, in the cross-section illustrated in FIG. 3, each of the barrier wall layers 105 exhibits a tapered shape. In addition to the above, the organic EL display panel 1 also includes a cathode 107, a sealing layer 108, and wiring layer portions 109. The cathode 107 is made of transparent material and is formed so as to cover the barrier wall layers 105 and the light-emission layers 106. The sealing layer 108 is made of light-transmissive material. The wiring layers 109 are made of the same metal as used for forming the anode 104. Further, each of the wiring layer portions 109 is disposed to be adjacent to one R light-emission layer 106R and one B light-emission layer 106B.

One example of the material for forming the anode 104 and the wiring layer 109 is Al. Examples of the material for forming the barrier wall layers 105 include acrylic resins, polyimide resins, and novolac-type phenolic resins. That is, the barrier wall layers 105 are formed by using material that is specified as organic material having insulating property and that is also specified as photosensitive resist material. In addition, the barrier wall layers 105 each have a film thickness of around 1 μm. One example of the material for forming the cathode 107 is indium tin oxide (ITO). One example of the material for forming the sealing layer 108 is silicon nitride (SiN).

2. Manufacturing Process of Organic EL Display Panel 1

Figure 4:
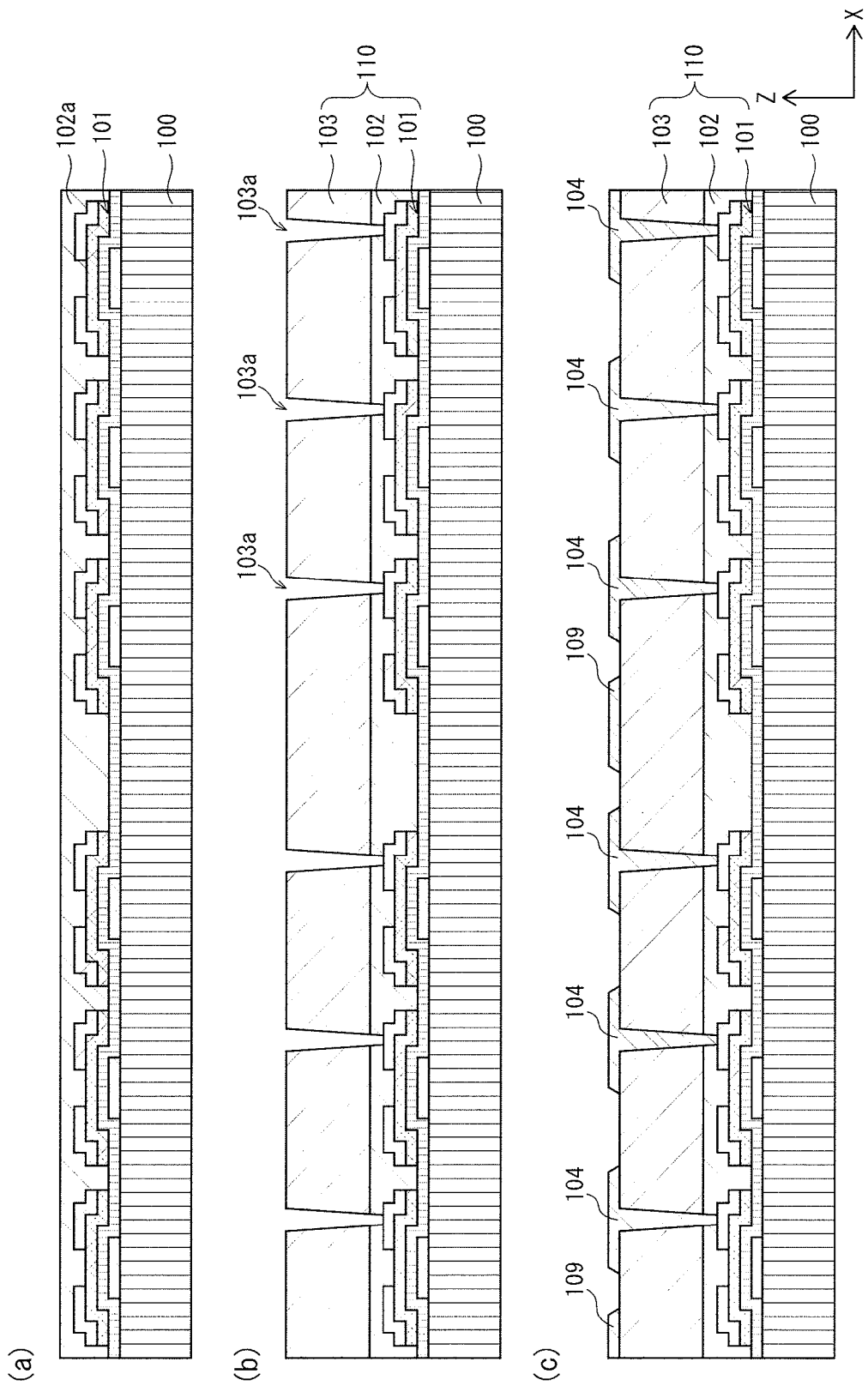
FIG. 4 includes cross-sectional views (a)-(c) each illustrating a procedure in the manufacturing process of the organic EL display panel illustrated in FIG. 1.
Figure 5:
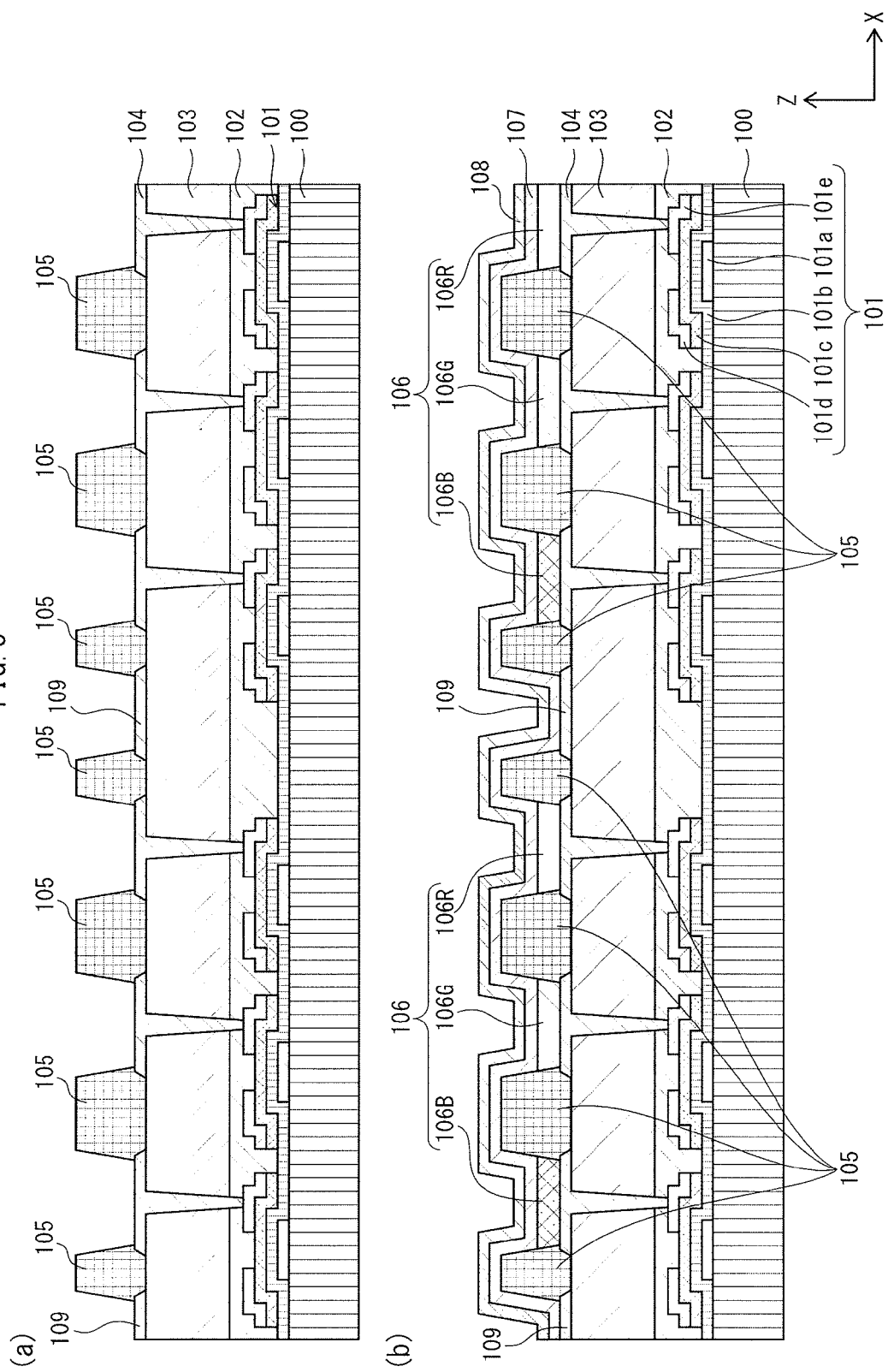
FIG. 5 includes cross-sectional views (a) and (b) each illustrating a procedure in the manufacturing process of the organic EL display panel illustrated in FIG. 1.

In the following, description is provided on the manufacturing process of the organic EL display panel 1. FIGS. 4 and 5 each illustrate procedures in the manufacturing process of the organic EL display panel 1.

First, as illustrated in portion (a) of FIG. 4, a substrate including the glass substrate 100 and an interlayer insulating film material layer 102a is prepared. The interlayer insulating film material layer 102a has the TFT layers 101 embedded therein. Specifically, to prepare such a substrate, a metal film is first formed on the glass substrate 100 by performing sputtering, vapor deposition or the like, and then the TFT layers 101 are formed by patterning the metal film formed on the glass substrate 100 by photolithography. Subsequently, the interlayer insulating film material layer 102a is layered onto the TFT layers 101 by performing spin-coating, vapor deposition, or the like.

Next, as illustrated in portion (b) of FIG. 4, the interlayer insulating layers 102 and the planarizing layers 103 are formed. Here, note that hole portions 103a are formed between adjacent ones of the interlayer insulating layers 102 and the planarizing layers 103, as illustrated in portion (b) of FIG. 4. Specifically, the interlayer insulating layers 102, the planarizing layers 103, and the hole portions 103a are formed by first layering the material for the planarizing layers 103 onto the interlayer insulating film material layer 102a by performing slit-coating or the like, and then performing patterning by photolithography.

Next, as illustrated in portion (c) of FIG. 4, the anodes 104 and the wiring layer portions 109 are formed on the planarizing layers 103. Specifically, the anodes 104 and the wiring layer portions 109 are formed by first forming an Al layer on the TFT substrate 110, which has been formed through the previous procedures, by performing sputtering or the like, and then patterning the Al layer so formed by photolithography.

Next, as illustrated in portion (a) of FIG. 5, the barrier wall layers 105 are formed between adjacent ones of the anodes 104. Specifically, the barrier wall layers 105 are formed by first layering a layer of the material of the barrier wall layers 105 so as to cover the anodes 104 and the wiring layer portions 109 by performing spin-coating or the like. Subsequently, a mask having apertures formed at portions thereof corresponding to the barrier wall layers 105 to be formed is disposed above the layer of the material of the barrier wall layers 105. Finally, by performing patterning by photolithography with the mask disposed above the layer of the material of the barrier wall layers 105, the barrier wall layers 105 are formed.

Next, as illustrated in portion (b) of FIG. 5, the light-emission layers 106, the cathode 107, and the sealing layer 108 are formed. The cathode 107 is formed so as to cover the barrier wall layers 105 and the light-emission layers 106. Specifically, first, application of organic material ink that is the material of the light-emission layers 106 is performed according to an inkjet printing method, and then the organic material ink so applied is left to dry. Subsequently, the organic material ink is further dried, this time in a forcible manner, by performing drying under reduced pressure, baking, etc. As such, the light-emission layers 106 are formed. As for the materials and the technologies used for forming the cathode 107 and the sealing layer 108, conventional materials and technologies in the field of organic light-emission devices are used.

The organic EL display panel 1 is manufactured through the above-described procedures.

3. Effects

As illustrated in FIG. 2, in the organic EL display panel 1 pertaining to the present embodiment, the G light-emission layer 106G, which generates the smallest amount of heat among the three light-emission layers, is arranged in between the B light-emission layer 106B and the R light-emission layer 106R, which generate a relatively great amount of heat than the G light-emission layer 106G. In addition, the wiring layer 109 is arranged to be adjacent to the B light-emission layer 106B and the R light-emission layer 106R, which generate a relatively great amount of heat. Due to the light-emission layers 106 and the wiring layer 109 being arranged in such a manner in the organic EL display panel 1, the B light-emission layer 106B has the facing edge portion 106B, which directly faces the wiring layer 109, and similarly, the R light-emission layer 106R has the facing edge portion 106R, which directly faces the wiring layer 109. In the meantime, the G light-emission layer 106G does not have a facing edge portion with respect to the wiring layer 109. Accordingly, the heat generated by the B light-emission layer 106B and the R light-emission layer 106R, which generate a greater amount of heat compared to the G light-emission layer 106G, is likely to be conducted to the wiring layer 109. As such, effective discharge of the heat generated by the B light-emission layer 106B, which generates a relatively great amount of heat, to the outside of the organic EL display panel 1 is realized.

Further, according to the above-described structure of the organic EL display panel 1, the discharge of heat to the outside takes place via the wiring layer 109, which is formed internally within the organic EL display panel 1 and is made of metal. Due to this, compared to a structure where a heat discharge function is provided not internally but externally with respect to an organic EL display panel, the discharge of heat takes place more quickly and more effectively according to the structure of the organic EL display panel 1. In particular, when the organic EL display panel 1 has considerably large size, the above-described structure is advantageous since quick and effective discharge of heat from a light-emission layer surrounded by other light-emission layers within the panel surface is realized.

Embodiment 2

In the following, description is provided on embodiment 2 of the present invention, differing from embodiment 1 in terms of the shape of the wiring layer. As such, note that description on structures similar to embodiment 1 is omitted hereafter.

Figure 6:
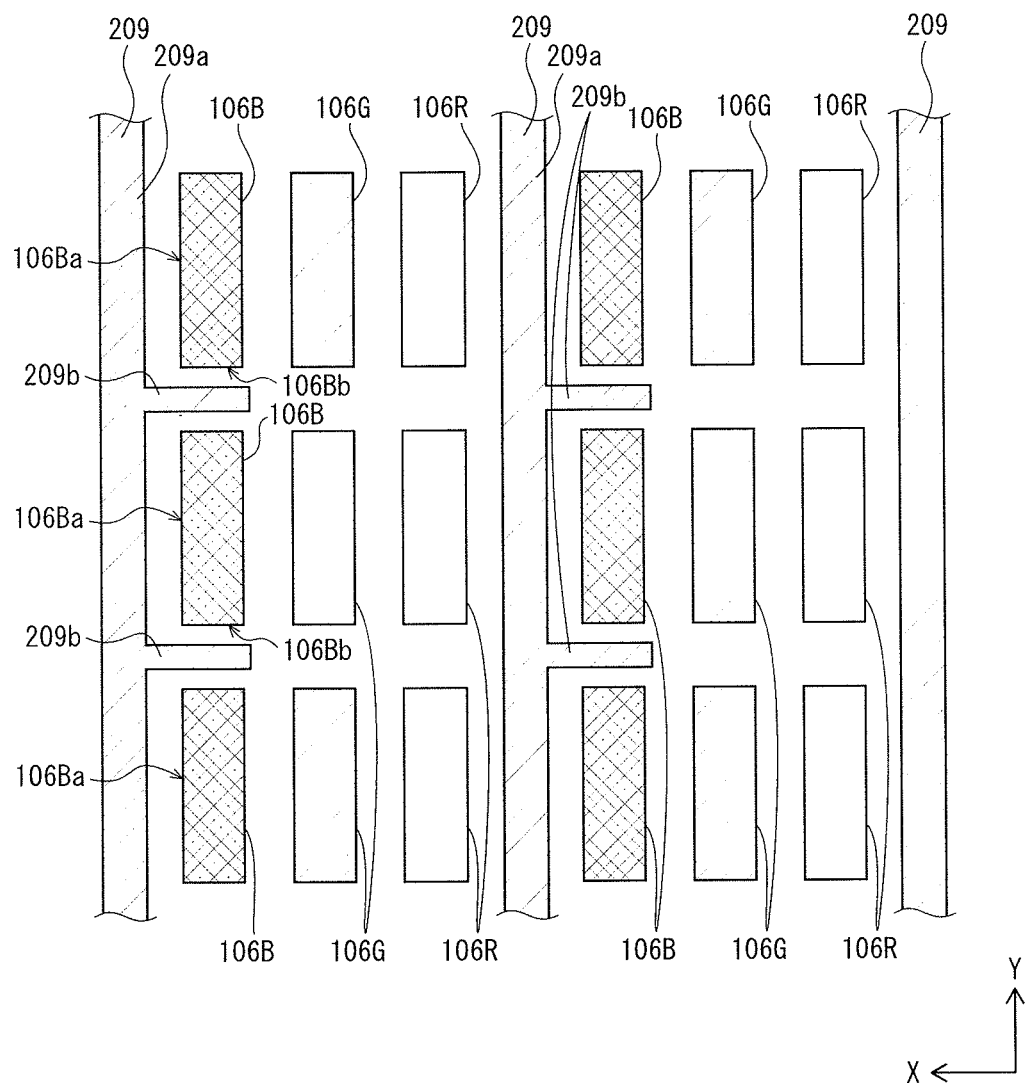
FIG. 6 is a plan view illustrating a layout of light-emission layers and a wiring layer in an organic EL display panel pertaining to a modified embodiment.

FIG. 6 is a plan view illustrating a layout of light-emission layers and a wiring layer in an organic EL display panel pertaining to embodiment 2.

As illustrated in FIG. 6, a wiring layer 209 in the organic EL display panel pertaining to embodiment 2 includes line portions 209a and extending portions 209b. The line portions 209a are each formed to have the shape of a line. Each of the extending portions 209b extends from one of the line portions 209a and extends to oppose a short side of the B light-emission layer 106B.

In the above-described structure of the organic EL display panel pertaining to embodiment 2, the B light-emission layers 106B, which generates the greatest amount of heat among the light-emission layers 106 has a facing edge portion 106Bb in addition to the facing edge portion 106Ba, with respect to the wiring layer 209. As such, the total of the length(s) of the facing edge portion(s) (hereinafter referred to as the "total facing edge portion length") of the B light-emission layer 106B is increased compared to in embodiment 1. Due to this, the organic EL display panel pertaining to embodiment 2 more effectively discharges the heat generated by the B light-emission layer 106B to the outside compared to the organic EL display panel 1 in embodiment 1.

Embodiment 3

In the following, description is provided on another embodiment of the present invention, differing from embodiment 2 in terms of the shape of the wiring layer. As such, note that description on structures similar to embodiments 1 and 2 are omitted hereafter.

Figure 7:
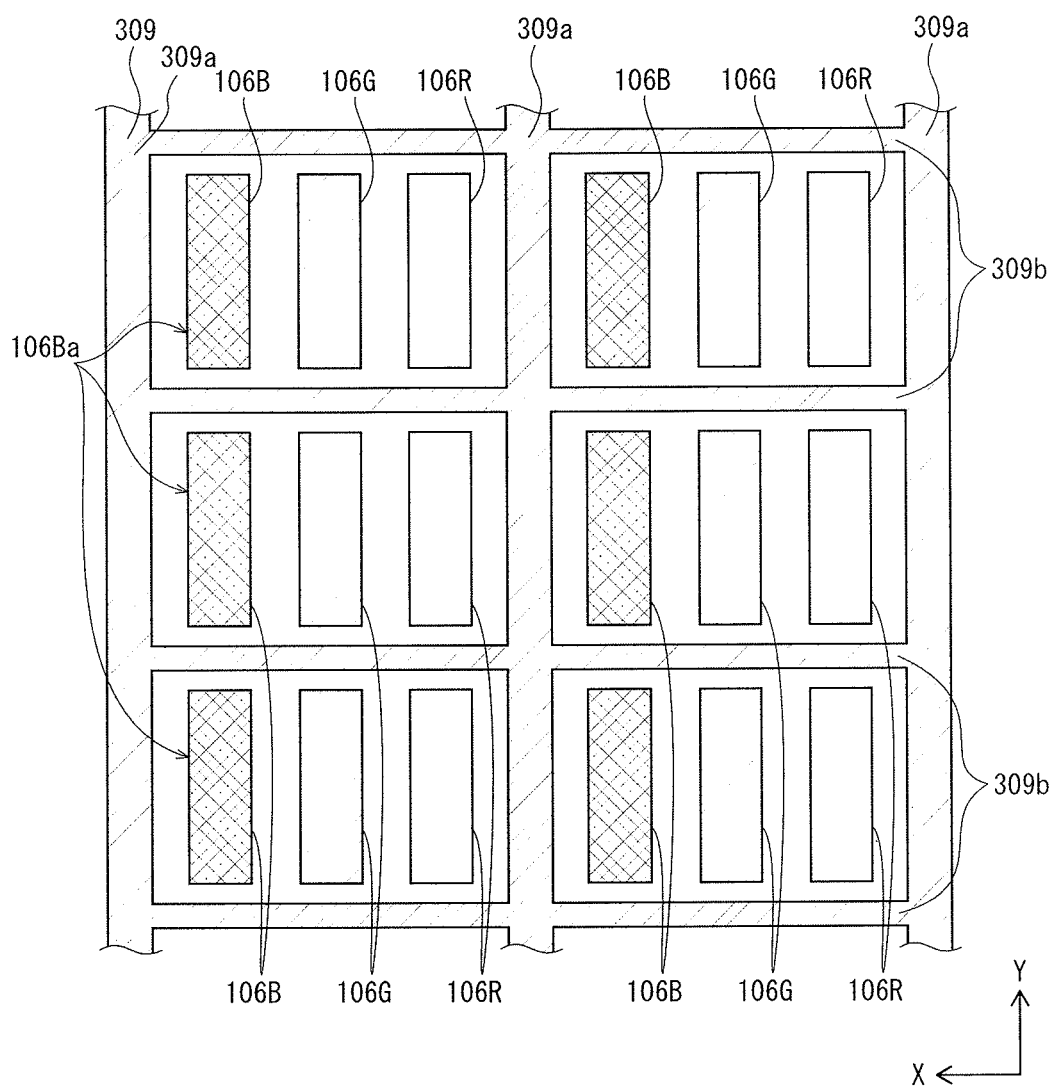
FIG. 7 is a plan view illustrating a layout of light-emission layers and a wiring layer in an organic EL display panel pertaining to a modified embodiment.

FIG. 7 is a plan view illustrating a layout of light-emission layers and a wiring layer in an organic EL display panel pertaining to embodiment 3.

As illustrated in FIG. 7, a wiring layer 309 in the organic EL display panel pertaining to embodiment 3 includes line portions 309a and extending portions 309b. The line portions 309a are each formed to have the shape of a line. Each of the extending portions 309b extend from one of the line portions 309a to an adjacent one of the line portions 309a. Due to this, the wiring layer 309, when seen as a whole, has the shape of a matrix.

In the above-described structure of the organic EL display panel pertaining to embodiment 3, the G light-emission layer 106G has a facing edge portion with respect to the wiring layer 309. Further, the total facing edge portion length of the R light-emission layer 106R with respect to the wiring layer 309 is increased compared to in embodiments 1 and 2. Due to this, the discharge of heat generated by the G light-emission layer 106G and the R light-emission layer 106R is promoted. Accordingly, as a whole, the organic EL display panel pertaining to embodiment 3 more effectively discharges the heat generated by the light-emission layers 106 to the outside compared to the organic EL display panels in embodiments 1 and 2.

Embodiment 4

In the following, description is provided on another embodiment of the present invention, differing from embodiment 3 in terms of the area of the light-emission layers. As such, note that description on structures similar to embodiments 1 through 3 is omitted hereafter.

Figure 8:
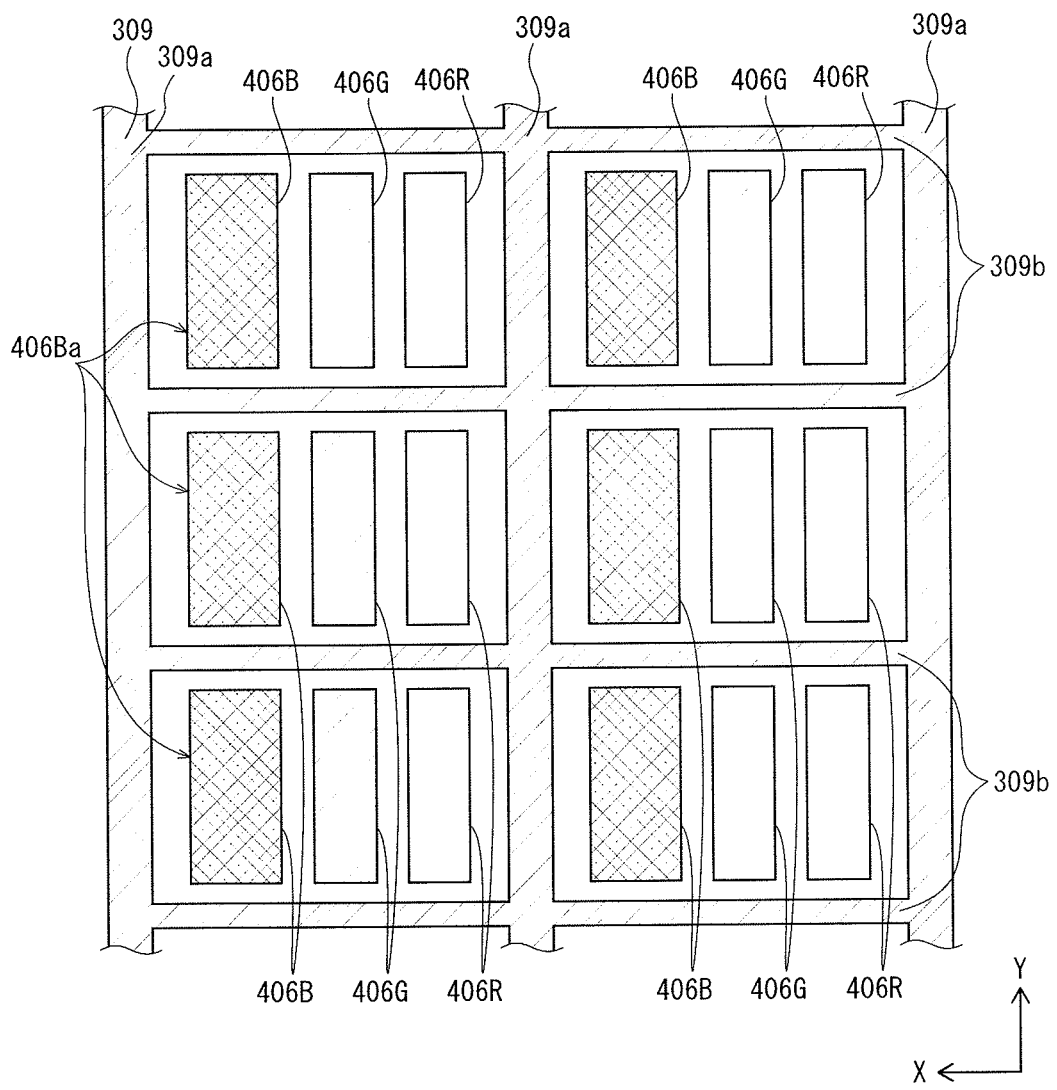
FIG. 8 is a plan view illustrating a layout of light-emission layers and a wiring layer in an organic EL display panel pertaining to a modified embodiment.

FIG. 8 is a plan view illustrating a layout of light-emission layers and a wiring layer in an organic EL display panel pertaining to embodiment 4.

Each pixel of the organic EL display panel pertaining to embodiment 4 includes a B light-emission layer 406B, a G light-emission layer 406G, and an R light-emission layer 406R. The B light-emission layer 406B, the G light-emission layer 406G, and the R light-emission layer 406R each have a rectangular shape. However, the B light-emission layer 406B differs in area from the G light-emission layer 406G and the R light-emission layer 406R. Specifically, the B light-emission layer 406B, which generates the greatest amount of heat among the three light-emission layers, has a greater area than each of the G light-emission layer 406G and the R light-emission layer 406R. Specifically, the long sides of the B light-emission layer 406B, the G light-emission layer 406G, and the R light-emission layer 406R have the same length. On the other hand, the short sides of the B light-emission layer 406B are longer than the short sides of each of the G light-emission layer 406G and the R light-emission layer 406R. Further, the wiring layer 309, when seen as a whole, has the shape of a matrix.

In the above-described structure of the organic EL display panel pertaining to embodiment 4, the B light-emission layer 406B, which generates the greatest amount of heat among the three light-emission layers, has facing edge portions corresponding to the short sides thereof, in addition to the facing edge portion corresponding to a long side thereof, with respect to the wiring layer 309. As such, the total facing edge portion length of the B light-emission layer 406B is increased compared to in embodiments 1, 2, and 3. As such, the organic EL display panel pertaining to embodiment 4 more effectively discharges the heat generated by the B light-emission layer 406B to the outside compared to the organic EL display panels in embodiments 1, 2, and 3.

Embodiment 5

In the following, description is provided on another embodiment of the present invention, differing from embodiment 1 in terms of the shapes and areas of the light-emission layers. As such, note that description on structures similar to embodiments 1 through 4 is omitted hereafter.

Figure 9:
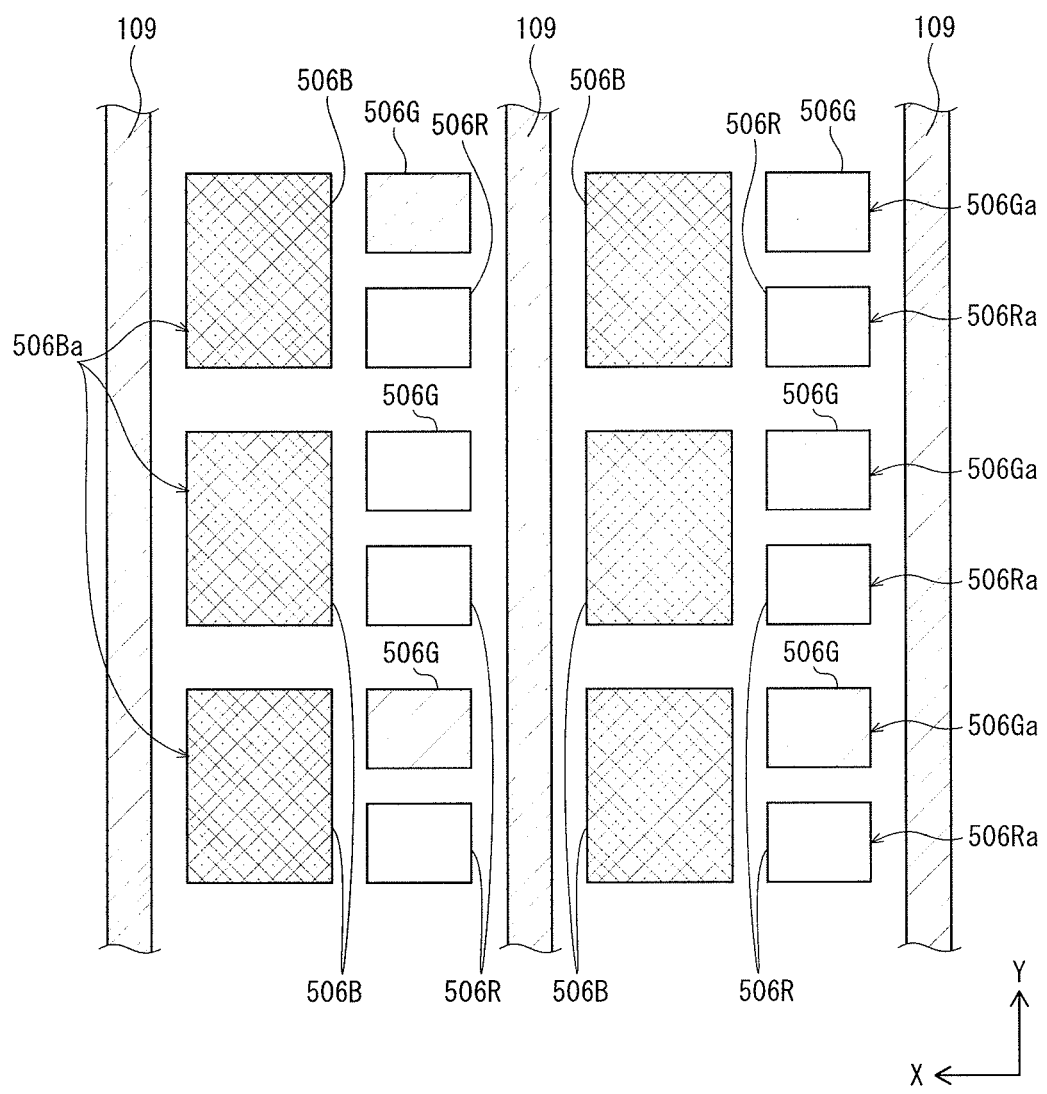
FIG. 9 is a plan view illustrating a layout of light-emission layers and a wiring layer in an organic EL display panel pertaining to a modified embodiment.

FIG. 9 is a plan view illustrating a layout of light-emission layers and a wiring layer in an organic EL display panel pertaining to embodiment 5.

Each pixel of the organic EL display panel pertaining to embodiment 5 includes a B light-emission layer 506B, a G light-emission layer 506G, and an R light-emission layer 506R. The B light-emission layer 506B, the G light-emission layer 506G, and the R light-emission layer 506R each have a rectangular shape. However, the B light-emission layer 506B differs in area from the G light-emission layer 506G and the R light-emission layer 506R. Specifically, the B light-emission layer 506B, which generates the greatest amount of heat among the three light-emission layers, has a greater area than each of the G light-emission layer 506G and the R light-emission layer 506R. This is since the long sides of the B light-emission layer 506B are longer than the long sides of each of the G light-emission layer 506G and the R light-emission layer 506R. Further, in the organic EL display panel pertaining to embodiment 5, the wiring layer 109 is formed in the shape of lines.

In the above-described structure of the organic EL display panel pertaining to embodiment 5, the B light-emission layer 506B, the G light-emission layer 506G, and the R light-emission layer 506R respectively have facing edge portions 506Ba, 506Ga, and 506Ra, with respect to the wiring layer 109. Further, the facing edge portion 506Ba of the B light-emission layer 509B, which generates the greatest amount of heat among the three light-emission layers, is longer than each of the facing edge 506Ga of the G light-emission layer 506G and the facing edge 506Ra of the R light-emission layer 506R. Due to having such a structure, the organic EL display panel pertaining to embodiment 5 realizes the same advantageous effects as the organic EL display panel 1 in embodiment 1.

Embodiment 6

In the following, description is provided on another embodiment of the present invention, differing from embodiment 1 in terms of the shapes and areas of the light-emission layers. As such, note that description on structures similar to embodiments 1 through 5 is omitted hereafter.

Figure 10:
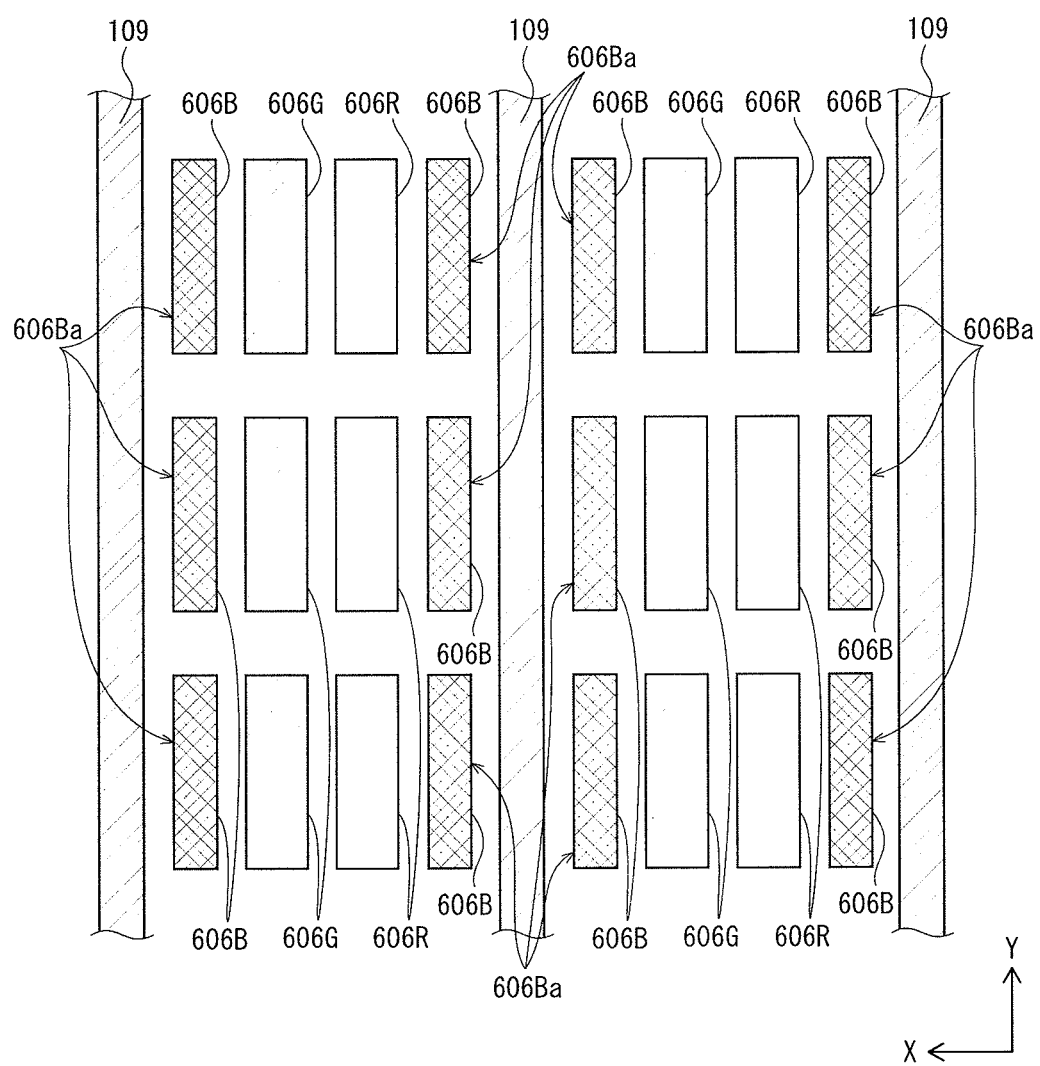
FIG. 10 is a plan view illustrating a layout of light-emission layers and a wiring layer in an organic EL display panel pertaining to a modified embodiment.

FIG. 10 is a plan view illustrating a layout of light-emission layers and a wiring layer in an organic EL display panel pertaining to embodiment 6.

In the organic EL display panel pertaining to embodiment 6, the wiring layer 109 is formed in the shape of lines. In addition, between adjacent extending portions of the wiring layer 109, four light-emission layers 606 are arranged in the shape of a matrix. Further, each pixel of the organic EL display panel pertaining to embodiment 6 includes one pair of B light-emission layers 606B, a G light-emission layer 606G, and an R light-emission layer 606R. More specifically, the G light-emission layer 606G and the R light-emission layer 606R are arranged in between the pair of B light-emission layers 606B. Here, it should be noted that the total of areas of the paired B light-emission layers 606B is equal to the area of each of the G light-emission layer 606G and the R light-emission layer 606R.

In the above-described structure of the organic EL display panel pertaining to embodiment 6, the total facing edge portion length of the paired B light-emission layers 606B (the total of the lengths of two facing edge portions 606Ba with respect to the wiring layer 109) is increased compared to in embodiment 1. As such, the organic EL display panel pertaining to embodiment 6 more effectively discharges the heat generated by the B light-emission layer (in this case, the paired B light-emission layers 606B), which generates the greatest amount of heat among the three light-emission layers, to the outside compared to the organic EL display panel 1 in embodiment 1.

Embodiment 7

In the following, description is provided on another embodiment of the present invention, differing from embodiment 1 in terms of the shapes and areas of the light-emission layers, and in terms of the shape of the wiring layer. As such, note that description on structures similar to embodiments 1 through 6 is omitted hereafter.

Figure 11:
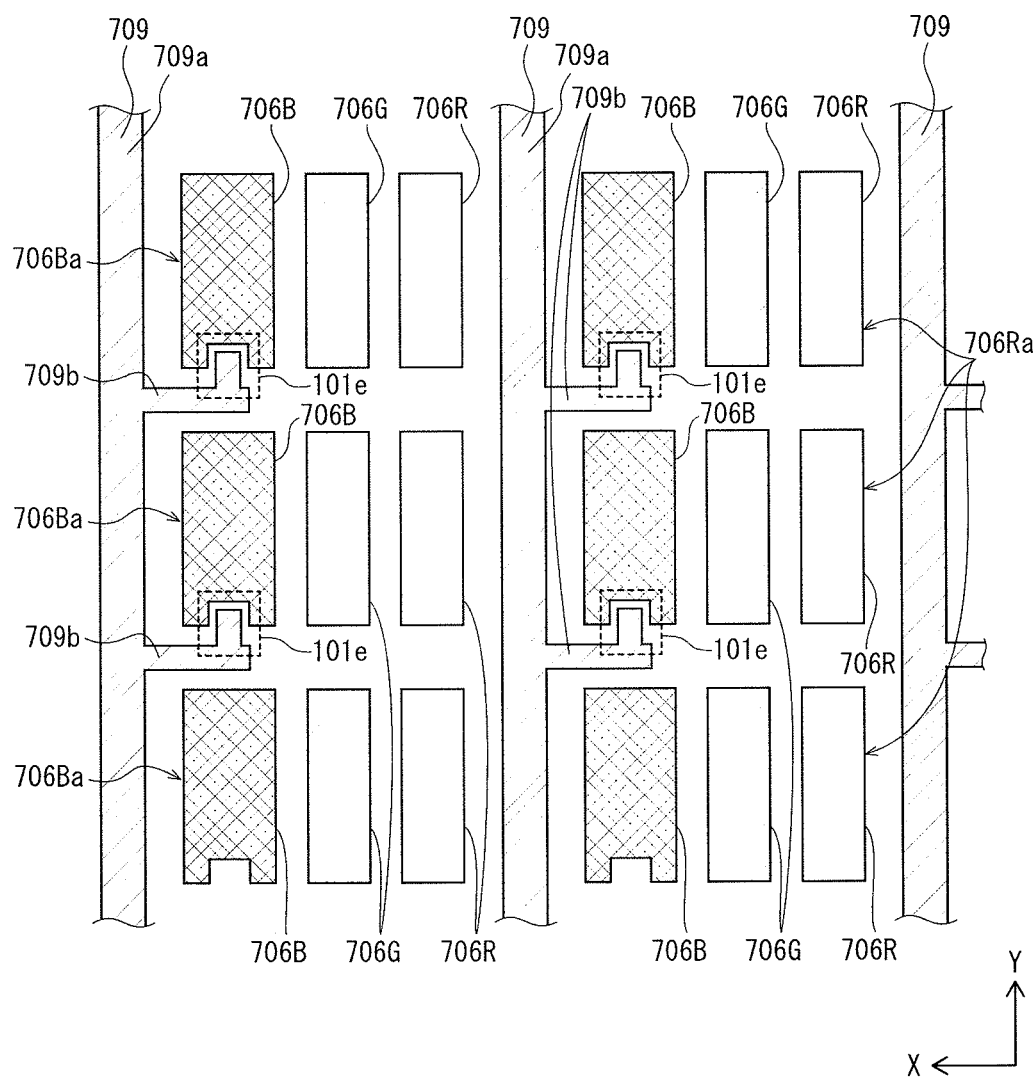
FIG. 11 is a plan view illustrating a layout of light-emission layers and a wiring layer in an organic EL display panel pertaining to a modified embodiment.

FIG. 11 is a plan view illustrating a layout of light-emission layers and a wiring layer in an organic EL display panel pertaining to embodiment 7.

Each pixel in the organic EL display panel pertaining to embodiment 7 includes a B light-emission layer 706B, a G light-emission layer 706G, and an R light-emission layer 706R. The B light-emission layer 706B has a greater area than each of the G light-emission layer 706G and the R light-emission layer 706R. Further, the organic EL display panel pertaining to embodiment 7 includes a wiring layer 709. The wiring layer 709 includes line portions 709a and extending portions 709b. The line portions 709a are each formed to have the shape of a line. Each of the extending portions 709b intersects with one of the line portions 709a and extends to oppose a short side of the B light-emission layer 706B. Further, each of the extending portions 709b extends to exist in an area above the drain electrode 101e in the corresponding one of the TFT layers 101.

Each of the TFT layers 101 as described above forms a drive transistor in the organic EL display panels pertaining to the embodiments. Typically, there exists a problem with such a drive transistor in that, when the drive transistor is exposed to high temperature, degradation of the on/off characteristics of the drive transistor takes place. However, in the above-described structure of the organic EL display panel pertaining to embodiment 7, each of the extending portions 709b of the wiring layer 709 is formed to exist in an area above the drain electrode 101e in one of the TFT layers 101. Due to this, the conduction of heat from above the B light-emission layer 706, which generates a relatively great amount of heat, to the drain electrode 101e is less likely to take place compared to in embodiment 1. As such, the degradation of the on/off characteristics of the drive transistor due to the drive transistor being exposed to high temperature is suppressed. Here, note that an effect similar to that described above is also achieved when each of the extending portions 709b extends and exists covering an area above electrodes of the TFT layer 101 other than the drain electrode 101e.

<Modifications>

Up to this point, description has been provided on the present invention with reference to exemplary embodiments thereof. However, the present invention is not limited to such embodiments, and various modifications may be made without departing from the spirit and the scope of the present invention. For example, each of the embodiments can be implemented in combination with one or more of the other embodiments. That is, for example, the description provided in different embodiments concerning the areas of the light-emission layers, etc., may be combined with one another. In the following, description is provided on other possible modifications.

1. Layer Structure

In the embodiments, description is provided based on a layer structure of a top-emission-type organic EL display panel. In a top-emission-type organic EL display panel, it is preferable that the anode have a characteristic of reflecting light and that the cathode having a substantially light-transmissive characteristic. Typically, in a top-emission-type organic EL display panel, each of the anode and the cathode has a multi-layer structure. However, the present invention is not limited to this, and is applicable to a bottom-emission-type organic EL display panel. With such a bottom-emission-type organic EL display panel, light emitted by a light-emission layer disposed above a glass substrate is guided out from the side of the glass substrate of the organic EL display panel. Alternatively, the present invention is applicable to a so-called "reversed-structure-type" organic EL display panel. In a reversed structure type organic EL display panel, an electrode closer to the substrate than the other electrode functions as the cathode. Further, although there are bottom-emission-type and top-emission-type variations to such a reversed-structure-type organic EL display panel, the present invention is applicable to either one of such variations and is expected to achieve advantageous effects when applied to either variation.

2. Shape and Structure of Light-emitting Layer

In the embodiments, description is provided on an organic EL display panel having light-emission layers each exhibiting a rectangular shape in plan view. However, the present invention is not limited to this. That is, in the organic EL display panel pertaining to the present invention, the light-emission layers may each have for example, an elongated shape of an ellipse, etc., or a circular shape. In addition, in the embodiments, description is provided on organic EL display panels including three types of light-emission layers differing in terms of heat generation amount. However, the present invention is not limited to this. That is, the number of types of light-emission layers having different heat generation amounts included in the organic EL display panel pertaining to the present invention may, for example, be two or four. For example, in a case where the organic EL display panel pertaining to the present invention includes four types of light-emission layers differing in terms of heat generation amount, the four types of light-emission layers may be realized by using color filters of the four colors B, R, G, and white (W).

3. Heat Generation Amount of Light-Emitting Layer

In the embodiments, description is provided that the light-emission layers included in the light-emission units, each of a different light-emission color, generate different amounts of heat when the light-emission units are caused to emit light at the same luminance. Further, description is also provided on the relation between the heat generation amounts of the light-emission layer such that the B light-emission layer generates the greatest amount of heat, the R light-emission layer generates an intermediate amount of heat, and the G light-emission layer generates the smallest amount of heat. However, this relation between the heat generation amounts of the light-emission layers may change depending upon the light-emission efficiency of the light-emission material contained in the light-emission layers. However, even if the relation between the heat generation amounts of the light-emission layers changes as described above, it suffices to change the arrangement of the light-emission layers in the organic EL display panel pertaining to the present invention such that the light-emission layer generating the greatest amount of heat is arranged at the position of the B light-emission layer in the embodiments, the light-emission layer generating the intermediate amount of heat is arranged at the position of the R light-emission layer in the embodiments, and the light-emission layer generating the smallest amount of heat is arranged at the position of the G light-emission layer in the embodiments.

4. Light-Emission Material

The light-emission material contained in the light-emission layers of the organic EL display panel pertaining to the present invention may be a combination of several types of material having a light-emission function. When the light-emission material is a combination of several types of material having a light-emission function as described above, the hole/electron mobility, the hole/electron injection characteristics, and the light-emission chromaticity of the light-emission layers becomes adjustable. Further, the light-emission material may be a dopant in an application solution, i.e., a mixture of the dopant and host material, used for forming the light-emission layers. In such a case, the dopant in the application solution for forming the light-emission layers may be organic light-emission material of a phosphorescent type.

Further, in such a case, each of the dopant and the host material in the application solution may be a low molecular weight material, a high molecular weight material, an olygomer, etc. Further, in such a case, the application solution may be various combinations of the above-described materials. For example, the application solution may be prepared by adding a dopant of a low molecular weight material as an additive to a host material of a high molecular weight material. Further, the light-emission material may be an organic light-emission material. Here, any type of organic light-emission material may be used as the light-emission material, provided that the organic light-emission material dissolves in a solvent and a thin film thereof is formable through application of the solution including the organic light-emission material. Examples of such organic light-emission material include a polyfluorene type polymer, a polyphenylene vinylene type polymer, and a low molecular weight type polymer of a pendant type, a dendrimer type, and an application type.

Further, such organic light-emission material includes a fluorescent type and a phosphorescent type. Typically, organic light-emission material of the fluorescent type has lower light-emission efficiency compared to organic light-emission material of the phosphorescent type. Due to this, a greater amount of heat is generated by a light-emission layer containing organic light-emission material of a fluorescent type, compared to a light-emission layer containing organic light-emission material of a phosphorescent type. As such, the above-described effects of the present invention are achieved by arranging the light-emission layers in the organic EL display panel pertaining to the present invention such that a facing edge portion of a light-emission layer containing organic light-emission material of a fluorescent type is longer than a facing edge portion of a light-emission layer including organic light-emission material of a phosphorescent type.

Note that the light-emission material contained in the light-emission layers is not limited to organic light-emission material, and for example, inorganic light-emission material such as zinc oxide (ZnO) may be used instead.

5. Other Functional Layers

In the embodiments, description is provided on a structure where light-emission layers and a cathode are layered in the stated order above anodes. However, the present invention is not limited to this. That is, the organic EL display panel pertaining to the present invention may additionally include one or more functional layers such as an electron injection layer, an electron transport layer, a hole injection layer, and a hole transport layer. In addition, the provision of an IL layer as an electron blocking layer between a light-emission layer and a hole injection layer, which is a functional layer, is preferable for improving light-emission efficiency and longevity of the organic EL display panel pertaining to the present invention. Typically, as material for forming an electron blocking layer, high molecular weight material of a polyfluorene type that either (i) has a higher lowest unoccupied orbital (LUMO) level than the light-emission material contained in the light-emission layers or (ii) has lower electron mobility than the light-emission material contained in the light-emission layers is used. One example of high molecular weight material of the polyfluorene type having lower electron mobility than the light-emission material is TFB. However, the present invention is not limited to this, and other material may be used as the material for forming the electron blocking layer.

As material for forming the hole injection layer, organic material such as copper phthalocyanine and PEDOT (a conductive high molecular compound), or a metal oxide such as nickel oxide and tungsten oxide may be used. As material for forming the electron injection layer, a metal complex, organic material such as and oxydiazole, or a metal such as barium may be used.

In addition, in the embodiments, description is provided on a plurality of light-emission layers each having a different light-emission color. However, the present invention is not limited to this, and light-emission units each of a different light-emission color may be realized by using a combination of light-emission layers emitting white light and color filters of different light-emission colors. Here, it should be noted that even when using color filters of different light-emission colors as described above for realizing the light-emission units each of a different light-emission color, it is required for a light-emission layer disposed below a color filter transmitting a relatively small amount of light to emit light at greater luminance compared to another light-emission layer that is disposed below a color filter transmitting a relatively great amount of light. Due to this, the amount of heat generated by the light-emission layer disposed below the color filter transmitting a relatively small amount of light is greater than the amount of heat generated by the other light-emission layer disposed below the color filter transmitting a relatively great amount of light. As such, the present invention is also applicable to such a structure.

6. Shape of Wiring Layer

In the embodiments, line portions of the wiring layer are arranged such that pixels, each including one B light-emission layer, one G light-emission layer, and one R light-emission layer, exist between the line portions. However, the present invention is not limited to this. For example, another line portion may be additionally arranged between the B light-emission layers and the G light-emission layers illustrated in FIG. 2. When making such a modification, the organic EL display panel pertaining to the present invention more effectively discharges the heat generated by the B light-emission layers. Alternatively, a wiring layer having the shape of a grid pattern and surrounding each light-emission layer may be formed at all parts of or at a part of the light-emission device.

7. Material of Wiring Layer

In the embodiments, description is provided that the wiring layer and the anodes are formed by using the same material. Such a configuration has an advantageous effect of simplifying the manufacturing process. However, the present invention is not limited to this, and metal material having higher heat conductivity than the material used for forming the anodes may be used for forming the wiring layer. When making such a modification, the organic EL display panel pertaining to the present invention more effectively discharges the heat generated by the light-emission layers.

8. Definition of "Facing Edge Portion"

In the embodiments, description is provided on an example where, when the substrate is view from above, light-emission layers having rectangular shapes are arranged between a wiring layer having the shape of lines or the shape of a matrix. When light-emission layers have rectangular or square shapes, the definition of the term "facing edge portion" given above is applicable, and thus, a facing edge portion of a light-emission layer is specified as described above. However, the present invention is not limited to this, and as described in the above modifications, the organic EL display panel pertaining to the present invention may include light-emission layers having shapes other than a rectangular shape or a square shape. In the following, description is provided on the definition of the term "facing edge portion" to be applied when such modifications are made, by referring to specific examples.

8-1. When Wiring Layer has Shape of Line

When the wiring layer is formed to have the shape of lines, a facing edge portion is defined as a portion of an edge of a light-emission layer directly facing the wiring layer (i) that extends in a direction substantially parallel with the direction in which the wiring layer extends and (ii) that directly faces the wiring layer without another light-emission layer existing in between.

Further, when a portion of an edge of a light-emission layer directly faces the wiring layer in a case where the edge of the light-emission layer is formed of only straight lines and none of the portions of the edge extends in a direction parallel with the direction in which the wiring layer extends, the facing edge portion of the wiring layer is a portion of the edge of the light-emission layer extending in a direction closest to the direction in which the wiring layers extend, or that is, an edge portion of the light-emission layer that is substantially parallel with the direction in which the wiring layers extend.

In contrast, when a portion of an edge of a light-emission layer directly faces the wiring layer in a case where the edge of the light-emission layer has a portion that does not have the shape of a straight line, the facing edge portion of the light-emission layer is specified as follows. First, the light-emission layer is divided into two parts that are line-symmetrical with respect to a straight line that is parallel with the direction in which the wiring layers extend. Further, among the two edge portions respectively belonging to the two parts obtained by the dividing, an edge portion that is relatively closer to the wiring layer than the other is determined as the facing edge portion of the light-emission layer. This process of specifying the facing edge portion is applicable in cases such as where a light-emission layer directly facing the wiring layer has the shape of a lozenge, where a light-emission layer directly facing the wiring layer has an elliptical shape, and where a light-emission layer directly facing the wiring layer has a circular shape. For example, when a light-emission layer directly facing the wiring layer has a circular shape, the facing edge portion is specified as a circumferential portion of the circular light-emission layer that is relatively closer to the wiring layer, among the two circumferential portions respectively belonging to the two half-circles obtained by the dividing the circular light-emission layer into two line-symmetrical half-circles with respect to a straight line that is parallel with the line portions of the wiring layer.

8-2. When Wiring Layer has Shape of Matrix

When the wiring layer is formed to have the shape of a matrix, a facing edge portion is defined as a portion of an edge of a light-emission layer directly facing the wiring layer (i) that extends in a direction substantially parallel with one of two directions in which the wiring layer extends and (ii) that directly faces the wiring layer without another light-emission layer existing in between.

Here, in a case where an edge of a light-emission layer directly facing the wiring layer, which has the shape of a matrix, is formed of only straight lines and none of the portions of the edge extends in directions parallel with the directions in which the wiring layer extends, the facing edge portion of the wiring layer is the same edge portion as in the above-described case where the wiring layer has the shape of lines.

In contrast, description is provided in the following on a case where: (i) the wiring layer is formed to have the shape of a matrix; (ii) one light-emission layer is arranged for each pixel unit portion of the wiring layer in one direction among the two directions in which the wiring layer extends (hereinafter referred to as the "first direction"), and a plurality of light-emission layers are arranged for each pixel unit portion of the wiring layer in the other direction among the two directions in which the wiring layer extends (hereinafter referred to as the "second direction"); and (iii) an edge of a light-emission layer directly facing the wiring layer has a portion that does not have the shape of a straight line. In such a case, in order to specify the facing edge portion of the light-emission layer directly facing the wiring layer, first the light-emission layer is divided into two parts that are line-symmetrical with respect to a straight line that is parallel with the first direction. Further, the light-emission layer is equally divided into three parts by using two straight lines that are parallel with the second direction (i.e., each of the two line-symmetrical parts of the light-emission layer is divided into three parts, resulting in the light-emission layer divided into a total of six parts). Among the edge portions of the six parts of the light-emission layer so obtained, an edge portion that is closer to the wiring layer than to an adjacent light-emission layer is determined as a facing edge portion of the light-emission layer. This process of specifying the facing edge portion is applicable in cases such as where a light-emission layer directly facing the wiring layer has the shape of a lozenge, where a light-emission layer directly facing the wiring layer has an elliptical shape, and where a light-emission layer directly facing the wiring layer has a circular shape.

Note that in a case where one light-emission layer is arranged for each pixel unit portion of the wiring layer in each of the first and second directions described above, the entire edge of a light-emission layer directly facing the wiring layer corresponds to the facing edge portion of the light-emission layer. Further, in a case where a plurality of light-emission layers are arranged for each unit portion of the wiring layer in each of the first and second direction described above, the facing edge portion of a light-emission layer directly facing the wiring layer is specified as follows. First, the light-emission layer is equally divided into three parts in each of the first and second directions by using two lines that are parallel with the corresponding one of the first and second directions (i.e., the light-emission layer is divided into a total of nine parts). Among the edge portions of the nine parts of the light-emission layer so obtained, an edge portion that is closer to the wiring layer than to an adjacent light-emission layer is determined as a facing edge portion of the light-emission layer.

9. Product Implementation

Figure 12:
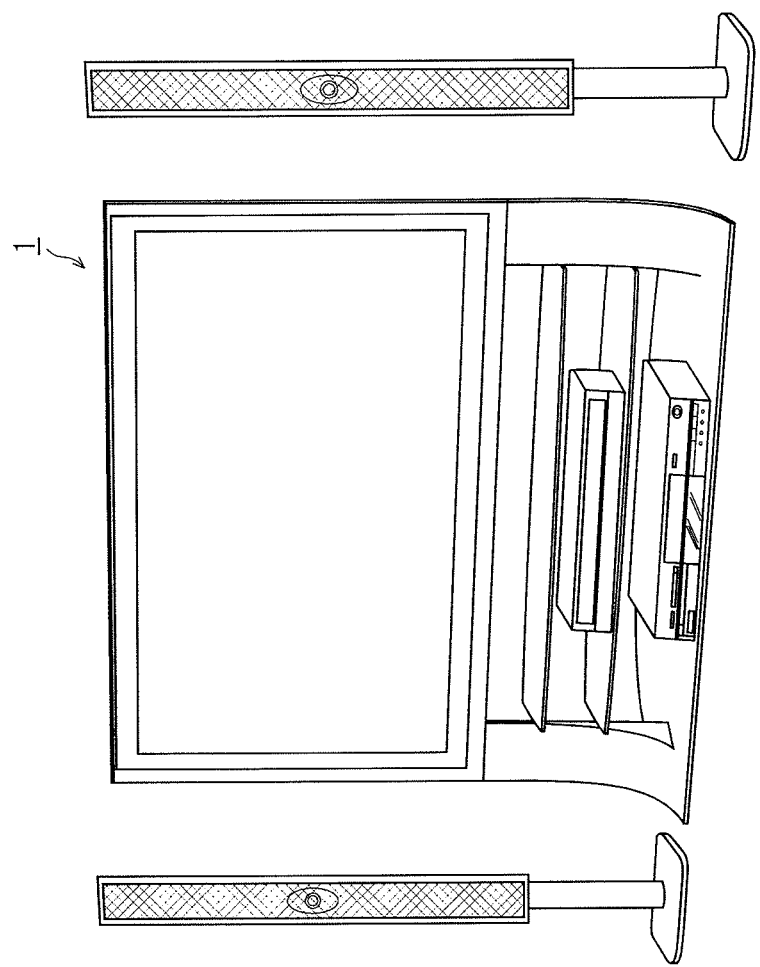
FIG. 12 is a schematic diagram illustrating an example of application of the organic EL display panel illustrated in FIG. 1.

The organic EL display panels pertaining to the embodiments are distributable on marketing channels each as a single device without making any changes thereto. However, the present invention is not limited to this, and each of the organic EL display panels are also distributable by being incorporated in a light-emission device such as a digital television, as illustrated in FIG. 12.

INDUSTRIAL APPLICABILITY

The present invention is usable in a light-emission device having a plurality of light-emission units each of a different color. In particular, the present invention is usable in an organic EL display panel or the like, and has versatility being widely applicable in the field of displays of various electronic devices, and thus has high usability.

REFERENCE SIGNS LIST 1 organic EL display panel
3 driving circuit 5 control circuit
100 substrate
101 TFT layer
102 interlayer insulating layer
103 planarizing layer
110 TFT substrate
104 anode
112 barrier wall layer
106, 106B, 106G, 106R light-emission layers
106Ba, 106Ra facing edge portions
107 cathode
108 sealing layer
109 wiring layer

The invention claimed is:

1. A light-emission device comprising:
a substrate;
a first light-emission unit above the substrate, the first light-emission unit including a first light-emission layer that contains light-emission material;
a second light-emission unit above the substrate, the second light-emission unit including a second light-emission layer that contains light-emission material and that is adjacent to the first light-emission layer;
a third light-emission unit above the substrate, the third light-emission unit including a third light-emission layer that contains light-emission material and that is adjacent to the first light-emission layer, wherein an amount of heat that the third light-emission layer generates upon light emission is greater than each of an amount of heat that the first light-emission layer generates upon light emission and an amount of heat that the second light-emission layer generates upon light emission; and
a wiring layer above the substrate and adjacent to the third light-emission layer, the wiring layer being made of metal and comprising a line structure or a matrix structure, wherein
the third light-emission layer has a longer facing edge portion than each of the first light-emission layer and the second light-emission layer, a facing edge portion of a given light-emission layer being an edge portion directly facing the wiring layer, or
the third light-emission layer has a larger facing surface portion than each of the first light-emission layer and the second light-emission layer, a facing surface portion of a given light-emission layer being a surface portion directly facing the wiring layer.

2. The light-emission device of claim 1, wherein
the amount of heat that the second light-emission layer generates upon light emission is greater than the amount of heat that the first light-emission layer generates upon light emission, and
the second light-emission layer has a longer facing edge portion than the first light-emission layer, or
the second light-emission layer has a larger facing surface portion than the first light-emission layer.

3. The light-emission device of claim 1, wherein
the third light-emission layer has a greater area than each of the first light-emission layer and the second light-emission layer.

4. The light-emission device of claim 3, wherein
the second light-emission layer has a greater area than the first light-emission layer.

5. The light-emission device of claim 1, wherein
the third light-emission layer is provided in a pair, and
the first light-emission layer and the second light-emission layer are disposed between the pair.

6. The light-emission device of claim 1, wherein
the wiring layer comprises the line structure and includes a plurality of line portions, and
the third light-emission layer, the first light-emission layer, and the second light-emission layer are disposed, in the stated order, between each pair of the line portions.

7. The light-emission device of claim 1, wherein
the substrate includes a drive transistor electrically connected to the first light-emission layer, the second light-emission layer, and the third light-emission layer, and
a portion of the wiring layer exists above the drive transistor.

8. The light-emission device of claim 1, wherein
the third light-emission layer has lower light-emission efficiency than each of the first light-emission layer and the second light-emission layer.

9. The light-emission device of claim 8, wherein
the first light-emission layer and the second light-emission layer each contain organic light-emission material of a phosphorescent type as the light-emission material, and
the third light-emission layer contains organic light-emission material of a fluorescent type as the light-emission material.

10. The light-emission device of claim 1, wherein
the first light-emission layer, the second light-emission layer, and the third light-emission layer each include a pixel electrode made of metal,
a common electrode made of metal is disposed above the first light-emission layer, the second light-emission layer, and the third light-emission layer, the common electrode being continuous between the first light-emission layer, the second light-emission layer, and the third light-emission layer, and
the wiring layer, being at a distance from each of the pixel electrodes, being connected with the common electrode, and being electrically connected with the first light-emission layer, the second light-emission layer, and the third light-emission layer, functions as an auxiliary electrode.

11. A light-emission device comprising:
a substrate;
a first light-emission unit above the substrate, the first light-emission unit including a first light-emission layer that contains light-emission material;
a second light-emission unit above the substrate, the second light-emission unit including a second light-emission layer that contains light-emission material and that is adjacent to the first light-emission layer, wherein an amount of heat that the second light-emission layer generates upon light emission is greater than an amount of heat that the first light-emission layer generates upon light emission; and
a wiring layer above the substrate and adjacent to the second light-emission layer, the wiring layer made of metal and comprising a line structure or a matrix structure, wherein
the second light-emission layer has a longer facing edge portion than the first light-emission layer, a facing edge portion of a given light-emission layer being an edge portion directly facing the wiring layer, or
the second light-emission layer has a larger facing surface portion than the first light-emission layer, a facing surface portion of a given light-emission layer being a surface portion directly facing the wiring layer.

12. A light-emission device comprising:

a substrate;

a phosphorescent light-emission unit above the substrate, the phosphorescent light-emission unit including a phosphorescent light-emission layer that contains light-emission material of a phosphorescent type;

a fluorescent light-emission unit above the substrate, the fluorescent light-emission unit including a fluorescent light-emission layer that contains light-emission material of a fluorescent type and that is adjacent to the phosphorescent light-emission layer, wherein an amount of heat that the fluorescent light-emission layer generates upon light emission is greater than an amount of heat that the phosphorescent light-emission layer generates upon light emission; and a wiring layer above the substrate and adjacent to the fluorescent light-emission layer, the wiring layer made of metal and comprising a line structure or a matrix structure, wherein the fluorescent light-emission layer has a longer facing edge portion than the phosphorescent light-emission layer, a facing edge portion of a given light-emission layer being an edge portion directly facing the wiring layer, or the fluorescent light-emission layer has a larger facing surface portion than the phosphorescent light-emission layer, a facing surface portion of a given light-emission layer being a surface portion directly facing the wiring layer.

\* \* \* \* \*